United States Patent
Hu

(10) Patent No.: US 9,634,146 B2
(45) Date of Patent: Apr. 25, 2017

(54) METHOD FOR MANUFACTURING ASSEMBLY OF FLEXIBLE DISPLAY DEVICE AND ASSEMBLY OF FLEXIBLE DISPLAY DEVICE MANUFACTURED WITH SAME

(71) Applicant: Shenzhen China Star Optoelectronics Technology Co., Ltd., Shenzhen, Guangdong (CN)

(72) Inventor: Guoren Hu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 286 days.

(21) Appl. No.: 14/378,374

(22) PCT Filed: Nov. 29, 2013

(86) PCT No.: PCT/CN2013/088102
§ 371 (c)(1),
(2) Date: Aug. 13, 2014

(87) PCT Pub. No.: WO2015/077970
PCT Pub. Date: Jun. 4, 2015

(65) Prior Publication Data
US 2016/0247933 A1 Aug. 25, 2016

(30) Foreign Application Priority Data
Nov. 26, 2013 (CN) .......................... 2013 1 0611655

(51) Int. Cl.
*H01L 29/786* (2006.01)
*H01L 27/12* (2006.01)
*H01L 29/16* (2006.01)

(52) U.S. Cl.
CPC .... *H01L 29/78606* (2013.01); *H01L 27/1218* (2013.01); *H01L 27/1222* (2013.01);
(Continued)

(58) Field of Classification Search
CPC ........... H01L 29/78606; H01L 27/1218; H01L 27/1222; H01L 27/1272; H01L 27/1285; H01L 29/78675
(Continued)

(56) References Cited

U.S. PATENT DOCUMENTS

| 2003/0164501 A1* | 9/2003 | Suzuki ................ G02F 1/13454 |
| | | 257/72 |
| 2007/0057305 A1* | 3/2007 | Oates .................. H01L 23/5223 |
| | | 257/301 |

(Continued)

FOREIGN PATENT DOCUMENTS

| CN | 102651397 A | 8/2012 |
| CN | 102856173 A | 1/2013 |
| CN | 103247679 A | 8/2013 |
| CN | 103325815 A | 9/2013 |
| WO | WO2012128956 A1 | 9/2012 |

OTHER PUBLICATIONS

Imam et al. ("Charge transfer hysteresis in graphene dual-dielectric memory cell structure," Applied Physics Letters, 99, 0822109, 2011).*

*Primary Examiner* — Yasser A Abdelaziez
(74) *Attorney, Agent, or Firm* — Andrew C. Cheng

(57) ABSTRACT

The present invention provides a method for manufacturing an assembly of a flexible display device and an assembly of a flexible display device manufactured therewith. The method includes: (1) providing a flexible base (22); (2) forming a graphene layer (24) on the flexible base (22); (3) forming a protective layer (26) on the graphene layer (24); (4) forming a low-temperature polysilicon layer (28) on the protective layer (26). The method for manufacturing an assembly of a flexible display device and the assembly of the flexible display device manufactured therewith according to the present invention are such that the graphene layer is formed on the flexible base to effectively conduct out heat generated in the process of forming the low-temperature (Continued)

polysilicon layer so as to protect the flexible base from being affected by the heat without increasing the thickness of the protective layer thereby reducing internal stress and facilitating the realization of thinning.

8 Claims, 2 Drawing Sheets

(52) U.S. Cl.
CPC ...... *H01L 27/1262* (2013.01); *H01L 27/1285* (2013.01); *H01L 29/78603* (2013.01); *H01L 29/78675* (2013.01); *H01L 29/1606* (2013.01)

(58) Field of Classification Search
USPC .......................................................... 257/72
See application file for complete search history.

(56) References Cited

U.S. PATENT DOCUMENTS

| | | | | |
|---|---|---|---|---|
| 2011/0102721 | A1* | 5/2011 | Enomoto | G02F 1/133536 349/137 |
| 2012/0235118 | A1* | 9/2012 | Avouris | H01L 29/518 257/27 |
| 2013/0329366 | A1* | 12/2013 | Wang | H05K 7/20963 361/704 |
| 2014/0291819 | A1* | 10/2014 | Barth | H01L 23/53276 257/659 |

* cited by examiner

METHOD FOR MANUFACTURING ASSEMBLY OF FLEXIBLE DISPLAY DEVICE AND ASSEMBLY OF FLEXIBLE DISPLAY DEVICE MANUFACTURED WITH SAME

BACKGROUND OF THE INVENTION

1. Field of the Invention

The present invention relates to the field of displaying, and in particular to a method for manufacturing an assembly of a flexible display device and an assembly of a flexible display device manufactured with same.

2. The Related Arts

With the vivid and vigorous progress of displaying techniques and information devices, display devices have been evolved from the traditional cathode ray tubes (CRTs) to a flat panel display (FPD) era. A flexible display device, compared with a conventional rigid glass panel display device, possesses properties including being thinner and lighter, being flexible, being resistant to impact, and safety and is generally not constrained by location and space, thereby becoming the new trend of development of the next generation display devices.

A flexible thin-film transistor (TFT) substrate is one of the key components of the flexible display device and selection and development of substrate material is the most important issue for the development of the flexible display device. Heretofore, the available choices for flexible substrate materials include a plastic substrate, a thin glass substrate, and a metal foil, among which the plastic substrate enables the realization of being lighter and thinner, impact resistance, and reduced cost; however, the plastic substrate suffers shortcomings including being incapable of high temperature processes and having a relatively high thermal expansion coefficient.

Referring to FIG. 1, a schematic view is given to show the structure of a conventional flexible TFT substrate, which comprises: a glass substrate 100, a flexible base 300 formed on the glass substrate 100, a protective layer 500 formed on the flexible base 300, a low-temperature polysilicon layer 700, and a TFT array (not shown) formed on the low-temperature polysilicon layer 700, wherein the protective layer 500 comprises a silicon nitride layer 502 formed on the flexible base 300 and a silicon oxide layer 504 formed on the silicon nitride layer 502. The low-temperature polysilicon layer 700 is generally formed by annealing an amorphous silicon layer and further, the formation of the low-temperature polysilicon layer 700 also requires activation by laser. Laser activation generation a great amount of heat. The heat, when transmitted to the flexible base 300, may cause deformation of the flexible base 300, severely affecting the quality of the flexible TFT substrate.

As shown in FIG. 2, to overcome such a problem, another flexible TFT substrate that is currently available increases the thickness of the silicon oxide layer 504' of the protective layer 500' (from approximately 500 nm to 1-2 μm) in order to block the transmission of heat to the flexible base 300. However, although such a measure reduces, to some extents, the possibility of deformation of the flexible base 300, an excessively large thickness of the silicon oxide layer 504' would lead to an excessive stress, thereby affecting the curving performance of the flexible TFT substrate and also potentially causing other issues such as poor crystallization of the low-temperature polysilicon layer 700.

SUMMARY OF THE INVENTION

Thus, an object of the present invention is to provide a method for manufacturing an assembly of a flexible display device, which has a simple process, can effectively protect a flexible base from being affected by heat, and thus improve the quality of the assembly of the flexible display device.

Another object of the present invention is to provide an assembly of a flexible display device, which has a simple structure, is less affected by heat during a manufacturing process thereof, and has a reduced thickness so as to facilitate thinning thereof.

To achieve the objects, the present invention provides a method for manufacturing an assembly of a flexible display device, which comprises the following steps:

(1) providing a flexible base;
(2) forming a graphene layer on the flexible base;
(3) forming a protective layer on the graphene layer; and
(4) forming a low-temperature polysilicon layer on the protective layer.

The flexible base is made of polyethylene terephthalate, polyethylene naphthalate, or polyimide.

The graphene layer is formed on the flexible base by microwave chemical vapor deposition, transferring, or spin coating and the graphene layer has a thickness of 10 nm-100 nm.

The protective layer comprises at least one of a silicon nitride layer and a silicon oxide layer.

The low-temperature polysilicon layer is formed by subjecting an amorphous silicon layer to annealing, followed by being treated with doping and laser activation.

The present invention also provides a method for manufacturing an assembly of a flexible display device, which comprises the following steps:

(1) providing a flexible base;
(2) forming a graphene layer on the flexible base;
(3) forming a protective layer on the graphene layer; and
(4) forming a low-temperature polysilicon layer on the protective layer;

wherein the flexible base is made of polyethylene terephthalate, polyethylene naphthalate, or polyimide.

The graphene layer is formed on the flexible base by microwave chemical vapor deposition, transferring, or spin coating and the graphene layer has a thickness of 10 nm-100 nm.

The protective layer comprises at least one of a silicon nitride layer and a silicon oxide layer.

The low-temperature polysilicon layer is formed by subjecting an amorphous silicon layer to annealing, followed by being treated with doping and laser activation.

The present invention further provides an assembly of a flexible display device, which comprises: a flexible base, a graphene layer formed on the flexible base, a protective layer formed on the graphene layer, and a low-temperature polysilicon layer formed on the protective layer.

The flexible base is made of polyethylene terephthalate, polyethylene naphthalate, or polyimide.

The graphene layer is formed on the flexible base by microwave chemical vapor deposition, transferring, or spin coating and the graphene layer has a thickness of 10 nm-100 nm.

The protective layer comprises at least one of a silicon nitride layer and a silicon oxide layer.

The low-temperature polysilicon layer is formed by subjecting an amorphous silicon layer to annealing, followed by being treated with doping and laser activation.

The efficacy of the present invention is that the present invention provides a method for manufacturing an assembly of a flexible display device and an assembly of a flexible display device manufactured therewith, wherein a graphene layer is formed on a flexible base to effectively conduct out heat generated in a process of forming a low-temperature polysilicon layer so as to protect the flexible base from being affected by the heat without increasing the thickness of a protective layer thereby reducing internal stress and facilitating the realization of thinning.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
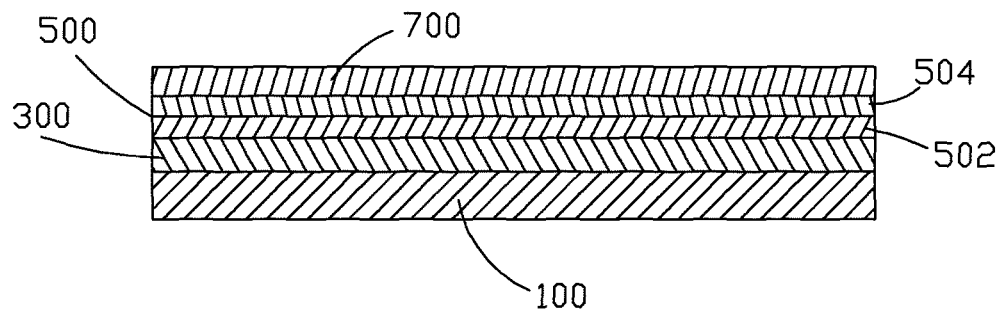
FIG. 1 is a schematic view showing the structure of a conventional flexible thin-film transistor (TFT) substrate.
Figure 2:
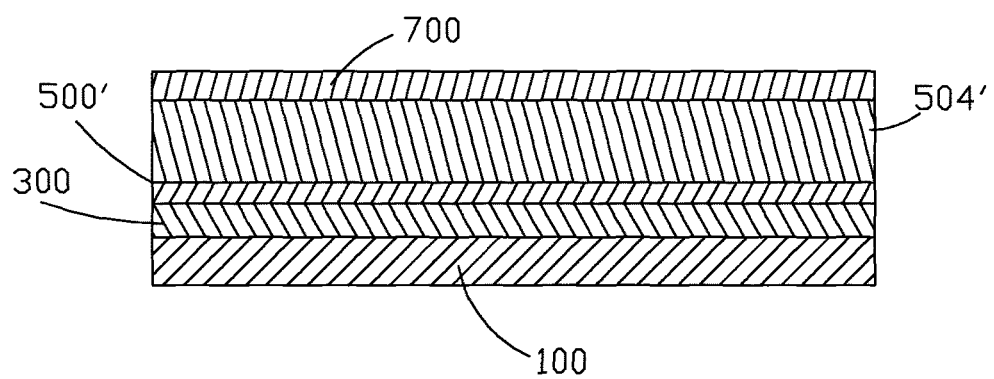
FIG. 2 is a schematic view showing the structure of another conventional flexible TFT substrate.
Figure 3:
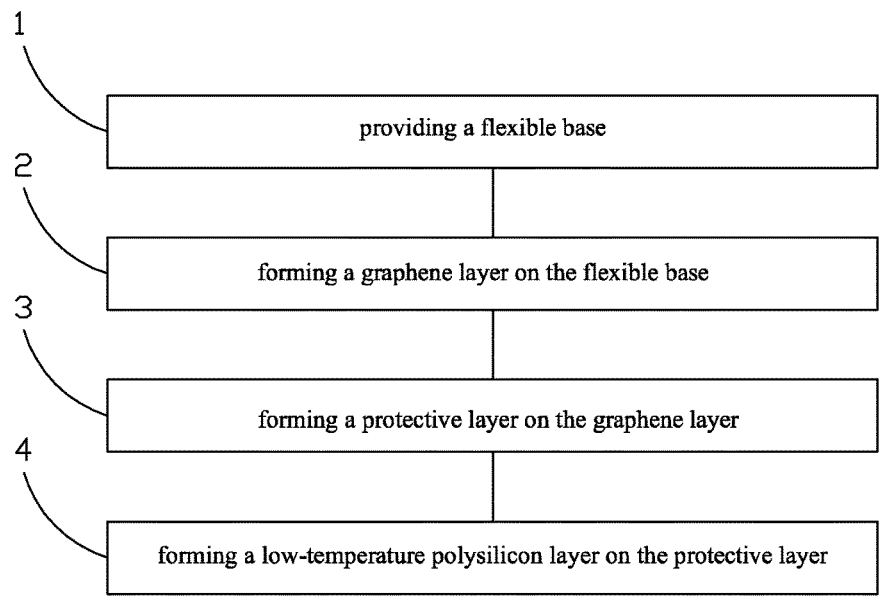
FIG. 3 is a flow chart illustrating a method for manufacturing an assembly of a flexible display device according to the present invention.
Figure 4:
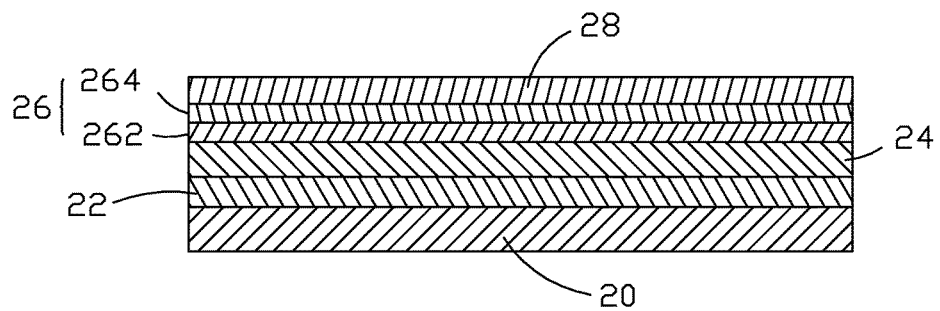
FIG. 4 is a schematic view showing the structure of an assembly of a flexible display device according the present invention.

Referring to FIGS. 3 and 4, the present invention provides a method for manufacturing an assembly of a flexible display device, which comprises the following steps:

Step 1: providing a flexible base 22.

The flexible base 22 is made of polyethylene terephthalate (PET), polyethylene naphthalate (PEN), or polyimide (PI). In the instant embodiment, the flexible base 22 is formed on a glass substrate 20.

Step 2: forming a graphene layer 24 on the flexible base 22.

The graphene layer 24 is formed on the flexible base 22 by a process of microwave CVD (Chemical Vapor Deposition), transferring, or spin coating. Graphene is a material of a single-layered sheet structure formed of carbon atoms and a three-dimensional structure of grapheme has extremely high equivalent thermal conductivity and extremely low interface thermal resistance so that the graphene layer 24 has excellent thermal conducting effect and can well conduct off heat to protect the flexible base 22. No specific limitation is applied to the thickness of the graphene layer 24; however, for consideration of thinning, the thickness is preferably 10 nm-100 nm.

It is noted that the graphene layer 24 can be made a complete layer or it can be patternized in order to suit different needs of different products.

Step 3: forming a protective layer 26 on the graphene layer 24.

The protective layer 26 comprises at least one of a silicon nitride (SiNx) layer 262 and a silicon oxide (SiOx) layer 264. In the instant embodiment, the protective layer 26 is a stack of a silicon nitride layer 262 and a silicon oxide layer 264, wherein the silicon nitride layer 262 is formed on the graphene layer 24 and the silicon oxide layer 264 formed on the silicon nitride layer 262. The silicon nitride layer 262 and the silicon oxide layer 264 can be formed by CVD.

Due to the arrangement of the graphene layer 24, the thickness of the silicon oxide layer 264 of the protective layer 26 can be made thinner (so that under this condition, the thickness of the silicon oxide layer 264 is set to be approximately 500 nm), whereby, compared to the prior art solution where the thickness of the silicon oxide layer is increased (so that the silicon oxide layer has a thickness of 1-2 µm), the thickness is apparently reduced thereby making the overall thickness of the assembly of the flexible display device relatively small.

Step 4: forming a low-temperature polysilicon layer 28 on the protective layer 26.

The low-temperature polysilicon layer 28 is formed by subjecting an amorphous silicon layer to annealing, following by being treated with doping and laser activation. During the laser activation, the heat generated by laser beam is conducted out by the graphene layer 24 so as to effectively protect the flexible base 22 from being affected by the heat without increasing the thickness of the protective layer 26 thereby facilitating the realization of thinning.

Referring to FIG. 4, the present invention also provides an assembly of a flexible display device, which comprises: a flexible base 22, a graphene layer 24 formed on the flexible base 22, a protective layer 26 formed on the graphene layer 24, and a low-temperature polysilicon layer 28 formed on the protective layer 26. In the instant embodiment, the assembly of the flexible display device is formed on a glass substrate 20.

Specifically, the flexible base 22 is made of polyethylene terephthalate (PET), polyethylene naphthalate (PEN), or polyimide (PI). The graphene layer 24 is formed on the flexible base 22 by a process of microwave CVD (Chemical Vapor Deposition), transferring, or spin coating. Graphene is a material of a single-layered sheet structure formed of carbon atoms and a three-dimensional structure of grapheme has extremely high equivalent thermal conductivity and extremely low interface thermal resistance so that the graphene layer 24 has excellent thermal conducting effect and can well conduct off heat to protect the flexible base 22. No specific limitation is applied to the thickness of the graphene layer 24; however, for consideration of thinning, the thickness is preferably 10 nm-100 nm.

The protective layer 26 comprises at least one of a silicon nitride layer 262 and a silicon oxide layer 264. In the instant embodiment, the protective layer 26 is a stack of a silicon nitride layer 262 and a silicon oxide layer 264, wherein the silicon nitride layer 262 is formed on the graphene layer 24 and the silicon oxide layer 264 formed on the silicon nitride layer 262. The silicon nitride layer 262 and the silicon oxide layer 264 can be formed by CVD.

Due to the arrangement of the graphene layer 24, the thickness of the silicon oxide layer 264 of the protective layer 26 can be made thinner (so that under this condition, the thickness of the silicon oxide layer 264 is set to be approximately 500 nm), whereby, compared to the prior art solution where the thickness of the silicon oxide layer is increased (so that the silicon oxide layer has a thickness of 1-2 µm), the thickness is apparently reduced thereby making the overall thickness of the assembly of the flexible display device relatively small.

The low-temperature polysilicon layer 28 is formed by subjecting an amorphous silicon layer to annealing, following by being treated with doping and laser activation. During the laser activation, the heat generated by laser beam is conducted out by the graphene layer 24 so as to effectively protect the flexible base 22 from being affected by the heat without increasing the thickness of the protective layer 26 thereby facilitating the realization of thinning.

It is noted that the graphene layer 24 can be made a complete layer or it can be patternized in order to suit different needs of different products.

In summary, the present invention provides a method for manufacturing an assembly of a flexible display device and an assembly of a flexible display device manufactured therewith, wherein a graphene layer is formed on a flexible base to effectively conduct out heat generated in a process of forming a low-temperature polysilicon layer so as to protect the flexible base from being affected by the heat without increasing the thickness of a protective layer thereby reducing internal stress and facilitating the realization of thinning.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing an assembly of a flexible display device, comprising the following steps:
    (1) providing a flexible base;
    (2) forming a thermal dissipation layer comprising a graphene layer on the flexible base;
    (3) forming a protective layer on the graphene layer, wherein the protective layer comprises a stack of a silicon nitride layer and a silicon oxide layer, and the silicon oxide layer has a thickness of 500 nm; and
    (4) forming an amorphous silicon layer on the protective layer and subjecting the amorphous silicon layer to annealing, doping, and laser activation so as to form a low-temperature polysilicon layer on the protective layer, wherein laser activation generates heat that is at least partly dissipated away through the thermal dissipation layer comprising the graphene layer.

2. The method for manufacturing an assembly of a flexible display device as claimed in claim 1, wherein the flexible base is made of polyethylene terephthalate, polyethylene naphthalate, or polyimide.

3. The method for manufacturing an assembly of a flexible display device as claimed in claim 1, wherein the graphene layer is formed on the flexible base by microwave chemical vapor deposition, transferring, or spin coating and the graphene layer has a thickness of 10 nm-100 nm.

4. A method for manufacturing an assembly of a flexible display device, comprising the following steps:
    (1) providing a flexible base;
    (2) forming a thermal dissipation layer comprising a graphene layer on the flexible base;
    (3) forming a protective layer on the graphene layer, wherein the protective layer comprises a stack of a silicon nitride layer and a silicon oxide layer, and the silicon oxide layer has a thickness of 500 nm; and
    (4) forming an amorphous silicon layer on the protective layer and subjecting the amorphous silicon layer to annealing, doping, and laser activation so as to form a low-temperature polysilicon layer on the protective layer, wherein laser activation generates heat that is at least partly dissipated away through the thermal dissipation layer comprising the graphene layer;
    wherein the flexible base is made of polyethylene terephthalate, polyethylene naphthalate, or polyimide.

5. The method for manufacturing an assembly of a flexible display device as claimed in claim 4, wherein the graphene layer is formed on the flexible base by microwave chemical vapor deposition, transferring, or spin coating and the graphene layer has a thickness of 10 nm-100 nm.

6. An assembly of a flexible display device, comprising: a flexible base, a thermal dissipation layer comprising a graphene layer formed on the flexible base, a protective layer formed on the graphene layer, and a low-temperature polysilicon layer formed on the protective layer by subjecting an amorphous silicon layer to annealing, doping, and laser activation, wherein heat generated by the laser activation is at least partly dissipated away through the thermal dissipation layer comprising the graphene layer, wherein the protective layer comprises a stack of a silicon nitride layer and a silicon oxide layer, and the silicon oxide layer has a thickness of 500 nm.

7. The assembly of the flexible display device as claimed in claim 6, wherein the flexible base is made of polyethylene terephthalate, polyethylene naphthalate, or polyimide.

8. The assembly of the flexible display device as claimed in claim 6, wherein the graphene layer is formed on the flexible base by microwave chemical vapor deposition, transferring, or spin coating and the graphene layer has a thickness of 10 nm-100 nm.

\* \* \* \* \*